United States Patent [19]

Torre

[11] Patent Number: 4,644,286

[45] Date of Patent: Feb. 17, 1987

[54] ARTICLE SURVEILLANCE SYSTEM RECEIVER USING SYNCHRONOUS DEMODULATION AND SIGNAL INTEGRATION

[75] Inventor: John J. Torre, Monroe, N.Y.

[73] Assignee: Allied Corporation, Morris Township, Morris County, N.J.

[21] Appl. No.: 777,060

[22] Filed: Sep. 17, 1985

[51] Int. Cl.[4] ...................... G08B 13/24; H03D 13/00

[52] U.S. Cl. ...................................... 329/50; 329/105; 329/124; 340/572

[58] Field of Search ................. 329/50, 122, 124, 105; 455/39, 63, 68; 340/572, 551; 343/6.8 R, 6.8 LC

[56] References Cited

U.S. PATENT DOCUMENTS

| | | | |
|---|---|---|---|
| 4,135,184 | 1/1979 | Pruzick | 343/6.8 R X |
| 4,215,342 | 7/1980 | Horowitz | 340/572 |
| 4,551,712 | 11/1985 | Fockens | 340/572 |

*Primary Examiner*—Siegfried H. Grimm
*Attorney, Agent, or Firm*—Ernest D. Buff; Gerhard H. Fuchs

[57] ABSTRACT

An article surveillance system includes a generator of a first inductive magneticc field having on and off duty cycle portions. The generator derives the first magnetic field at a predetermined AC frequency during the on duty cycle portions. The articles to be detected includes a structure which responds to the predetermined frequency of the first magnetic field to derive a second inductive magnetic field at a predetermined frequency. The second field is derived as a pulsed wave having a starting time at the expiration of each on-duty cycle portion and a predetermined carrier frequency. A receiver for the predetermined frequency of the second inductive magnetic field derives first and second different responses while an article including the structure is and is not in a detection region magnetically coupled to the receiver and transmitter. The receiver includes a synchronous detector for detecting first and second orthogonal components of the carrier frequency of the pulsed wave relative to a reference wave having a reference phase at the carrier frequency. The responses are derived independently of the amplitude of the carrier frequency components in the pulsed wave. The first and second responses are separately integrated over a predetermined interval, in synchronism with the occurrence time of each pulsed wave. The presence of the pulsed wave is indicated in response to either of the first or second responses having an absolute value in excess of a predetermined value during the interval.

22 Claims, 2 Drawing Figures

ARTICLE SURVEILLANCE SYSTEM RECEIVER USING SYNCHRONOUS DEMODULATION AND SIGNAL INTEGRATION

TECHNICAL FIELD

The present invention relates generally to detecting a pulsed wave having a predetermined carrier frequency, variable and unpredictable phase, and predetermined time position, and more particularly to detecting such a wave by utilizing synchronous demodulation and signal integration.

BACKGROUND ART

In certain situations it is desired to detect a pulsed wave having a predetermined carrier frequency and predetermined time position. The detection process is hindered because the carrier frequency of the pulsed wave has a variable, unpredictable phase and must be detected in the presence of background impulse energy containing the same frequency as the wave. The background energy generally subsists at the same frequency as the duration of the wave carrier frequency pulses.

In particular, in article surveillance systems, a first inductive magnetic field having on and off duty cycle portions is derived by a generator. The generator derives the first magnetic field so it has a predetermined carrier frequency during the on duty cycle portions. An article to be detected for surveillance purposes includes a structure similar to a tuned circuit or a resistance-inductance-capacitance (RLC) circuit that responds to the predetermined carrier frequency of the first magnetic field. The structure is arranged to derive a second inductive magnetic field at a predetermined frequency which is equal to or different slightly from the frequency of the first magnetic field. A receiver responds to the carrier frequency derived from the structure to derive first and second different responses while an article including the structure is in and is not in a detection region magnetically coupled to the receiver and the transmitter.

One type of prior art receiver includes processing circuitry that is enabled when the transmitter or generator on duty cycle has been completed. The processing circuitry responds to the second inductive magnetic field for a predetermined interval. The processing involves filtering the carrier frequency of the second magnetic field by use of a high Q bandpass filter tuned to the carrier frequency. It has been found that this type of time and frequency discrimination does not eliminate false alarms caused by magnetic field impulses. This is because the high Q bandpass filter has a tendency to be rung by impulse type inductive field noise, since the impulse noise is in the bandpass of the filter. The noise impulse excites the filter, causing the filter to ring and derive a wave that has virtually the same frequency, duration and amplitude as a waveform derived at the output of the filter in response to an article containing the structure causing derivation of the second magnetic field.

It is, therefore, accordingly an object of the present invention to provide a new and improved detection apparatus and method for a pulsed wave having a predetermined carrier frequency, variable unpredictable phase and a predetermined time position, wherein the wave is susceptible to being derived in the presence of background energy having either the same frequency as the wave for relatively short intervals or differing frequencies from the wave carrier frequency.

Another object of the invention is to provide a new and improved apparatus for detecting a pulsed unpredictable phase and predetermined time position, and wherein the apparatus is unresponsive to pulsed energy outside of a pass for the detector. Another object of the invention is to provide a new and improved article surveillance system employing a receiver that is synchronized with a carrier wave derived from energy storing structures on an article passing through a region supplied with a pulsed magnetic field, wherein the receiver is: responsive to the energy from the structure, effectively unresponsive to the energy from the field generating means, and is immune to magnetic field impulses.

DISCLOSURE OF INVENTION

In accordance with one aspect of the present invention, there is provided a detector for a pulsed wave having a predetermined carrier frequency, variable unpredictable phase and predetermined time position. The wave is derived in the presence of background energy having the same frequency as the wave but of shorter duration than the pulse wave, as well as impulse background energy. The detector synchronously detects orthogonal components of the carrier frequency to derive a response indicative of the phase of the components relative to a reference wave having a reference phase at the carrier frequency. The response is independent of the amplitude of the carrier frequency component in the pulsed wave. The response is separately integrated over a predetermined interval in synchronism with the occurrence time of each pulsed wave. The presence of the pulsed wave having the predetermined carrier frequency is indicated in response to the integrated response having an absolute value in excess of a predetermined value during the interval.

The integration is performed over an interval, that is sufficiently long relative to a single period of the pulsed wave carrier frequency as to accumulate the responses for many cycles of the pulsed wave carrier frequency to obtain a substantial non-zero value in response thereto. In addition, the value of T is sufficiently great to provide a zero net accumulation of the responses for frequencies which are only slightly displaced from the pulsed wave carrier frequency. The predetermined absolute value, V, is related to the duration T by approximately $V=0.35T$. The frequencies causing a net zero accumulation of the responses differ from the pulsed wave carrier frequency by in excess of $\pm 1/2T$ to control the band width of the detection process.

In the article surveillance application, the integration process starts at a predetermined time relative to the expiration of each on-duty cycle portion, preferably immediately after each on-duty cycle portion has been completed. The accumulated integrated values are reset to zero immediately prior to the beginning of each pulsed wave. To provide decoupling between the transmitter or generator and receiver, the integration process is effectively terminated while the transmitter is deriving the inductive AC magnetic field which is coupled to the structure on the article being monitored. Synchronization of the receiver for the pulsed carrier wave derived from the structure on the article is provided by synchronizing the activation time of the integration in the receiver to the expiration of the on-duty cycle of the transmitter, by utilizing AC power line zero crossing detectors in the transmitter and receiver.

In the preferred embodiment the synchronous detection is performed by first and second synchronous demodulators having first inputs respectively responsive to orthogonal phases of the carrier frequency of the reference wave and second input responsive to the carrier frequency of the pulsed wave. The first and second demodulators respectively derive first and second signals having bi-polar values and amplitudes indicative of the phase angles between the pulsed wave carrier frequency and the orthogonal phases of the carrier frequency of the reference wave. An integrating means separately responds to the first and second signals to derive first and second integrated signals. In response to the absolute value of either first or second integrated signals respectively exceeding and being less than a predetermined reference value, the indication of the surveilled article being in the region is derived.

The above and still further objects, features and advantages of the present invention will become apparent upon consideration of the following detailed description of one specific embodiment thereof, especially when taken in conjunction with the accompanying drawings.

BEST MODE FOR CARRYING OUT THE INVENTION

Figure 1:
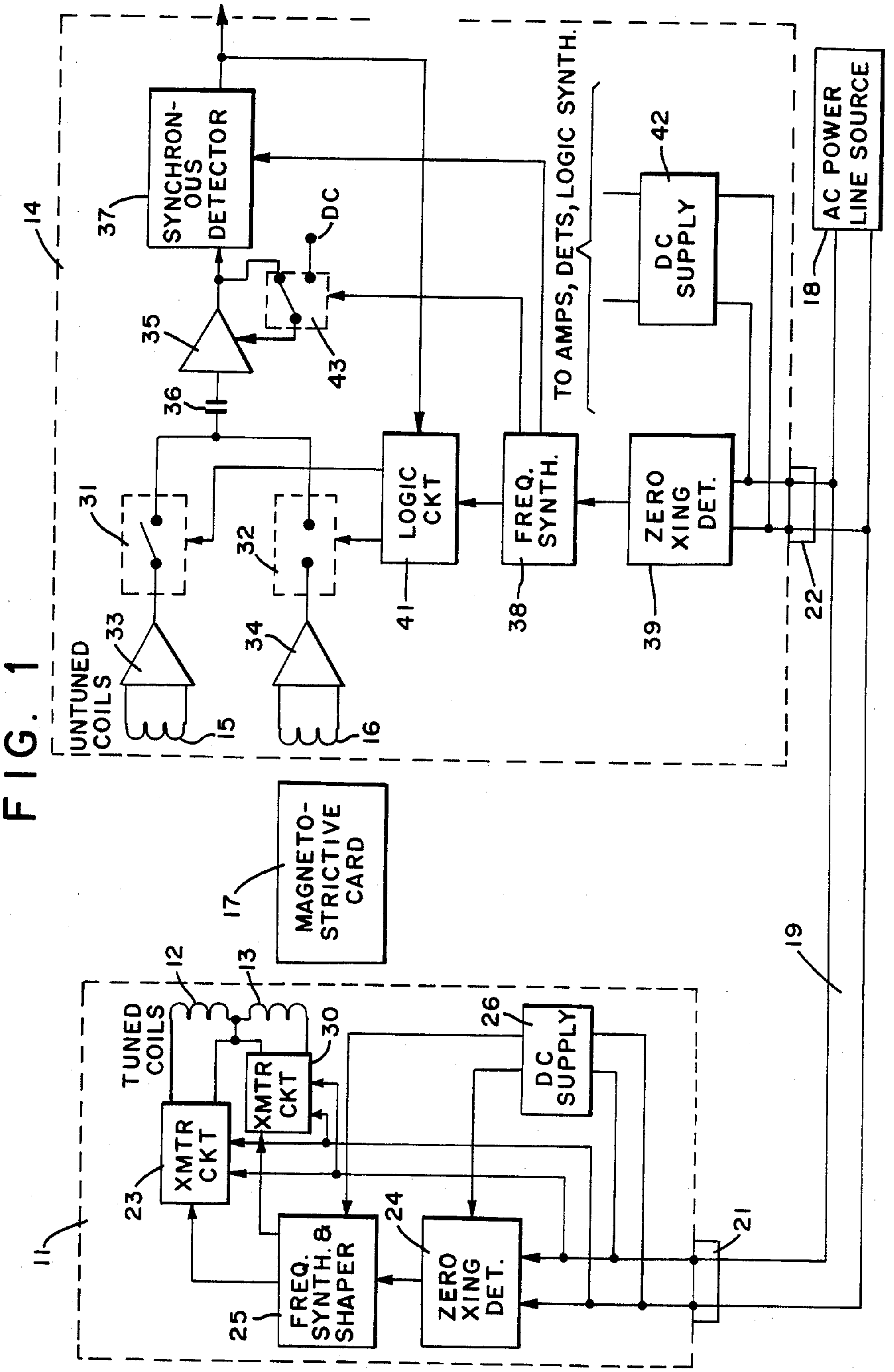
FIG. 1 is a block diagram of an article surveillance system including a magnetic field generator in accordance with the present invention.

Reference is now made to FIG. 1 of the drawing wherein there is illustrated a surveillance system incorporating the present invention. The surveillance system includes a power line activated inductive magnetic field generator or transmitter 11 having an on-off-duty cycle considerably less than 50%. While generator 11 is activated into the on duty cycle portion, it derives a first AC magnetic field having a predetermined frequency, typically 60 KHz. In the preferred embodiment, the duty cycle is approximately 6.4%, achieved by having on and off duty cycle portions with durations of 1.6 and 23.4 milliseconds, respectively. The magnetic field derived by generator 11 is inductively coupled from tuned coils 12 and 13, located on one wall of a region to be monitored.

Inductive AC magnetic field power line activated receiver 14 is selectively responsive to the magnetic field derived by generator 11. Receiver 14 includes untuned magnetic field responsive coils 15 and 16, mounted on a wall opposite from the wall containing coils 12 and 13. AC magnetic field inductive coupling subsists between coils 12 and 13 and at least one of coils 15 and 16 while coils 12 and 13 derive the magnetic field generated by transmitter 11. However, receiver 14 is effectively decoupled from coils 15 and 16 while coils 12 and 13 are energized. A second inductive magnetic field having a fixed predetermined carrier frequency but variable duration and amplitude is coupled to coils 15 and 16 and receiver 14 immediately after expiration of the on duty cycle portion of transmitter 11 when an article containing magneto-strictive card 17 passes in the region between the walls containing coils 12, 13 and 15–16. The second field is detected and recognized by receiver 14 as being associated with the article passing between coils 12, 13 and 15, 16.

Card 17 is preferably manufactured in accordance with the teachings of commonly assigned U.S. Pat. No. 4,510,489, to Anderson III, et al. Typically, card 17 is carried on an article to be detected by an interaction of components in the card and the magnetic field derived from generator 11 and activated state, wherein it effectively functions as a resistance-inductance-capacitance (RLC) circuit that responds to the AC inductive magnetic field derived by generator 11. Card 17 stores the magnetic field derived from generator 11. When a pulse of the first magnetic field has terminated, the elements in magneto-strictive card 17 re-radiate the second magnetic field that is detected by receiver 14. Magnetostrictive card 17 is selectively deactivated by an appropriate operator, such as a checkout cashier, causing the AC inductive magnetic field re-radiated by the card to be undetectable by receiver 14.

Transmitter 11 and receiver 14 are synchronously activated in response to zero crossings of AC power line source 18, to enable the receiver to respond to the inductive magnetic field re-radiated from card 17 upon completion of an on duty cycle portion of transmitter 11. By synchronizing the operation of generator 11 and receiver 14 in response to zero crossings of AC power line source 18, electronic circuits included in the generator and receiver need not be electrically connected together, except by power line 19 that is connected to conventional male plugs 21 and 22 of the generator and receiver, respectively.

Generator 11 includes transmitter circuits 23 and 30 for separately and simultaneously driving tuned coils 12 and 13 with a 60 KHz carrier having a 6.4% duty cycle, such that coils 12 and 13 are supplied with sinusoidal currents at a predetermined constant frequency of 60 KHz for 1.6 milliseconds. For the next 23.4 milliseconds, coils 12 and 13 are not driven by transmitter circuits 23 and 30.

Transmitter circuits 23 and 30 are identical, with each including a transformerless AC power line to DC converter and switch means that supplies currents from opposite terminals of the AC to DC converter to coils 12 and 13 at the 60 KHz frequency, during the on duty cycle portions. To these ends, transmitter circuits 23 and 30 are directly responsive to the AC power line voltages on line 19, as coupled to generator 14 by way of male plug 21. Transmitter circuits 23 and 30 are activated into the on duty cycle portions thereof in synchronism with zero crossings of the AC voltage of power line 19, as coupled to generator 11 by way of plug 21, a result achieved by connecting zero crossing detector 24 to plug 21 so that detector derives a pulse each time the voltage on power line 19 goes through a zero value. The zero crossing indicating pulses derived by detector 24 are coupled to frequency synthesizer and shaper 25, having outputs fed to transmitter circuits 23 and 30, to cause the transmitter circuits to be activated to produce the 60 KHz bursts having the 6.4% duty cycle.

DC power is supplied to components in zero crossing detector 24 and frequency synthesizer and shaper 25 by DC supply 26, connected to line 19 by male plug 21. Supply 26 does not have the capability of providing sufficient power to derive the necessary AC inductive magnetic fields from coils 12 and 13 to be a power supply for transmitter circuits 23 and 30.

Transmitter circuits 23 and 30 are responsive to frequency synthesizer and shaper 25 so that both the transmitter circuits are simultaneously activated to simultaneously derived the same frequency during the on duty cycle portion of each activation cycle of the transmitter circuits. During alternate on duty cycle portions, transmitter circuits 23 and 30 supply in phase and out of phase currents to coils 12 and 13. Thus, during a first on duty cycle portion, the currents supplied by transmitter circuits 23 and 30 to coils 12 and 13 cause currents to flow in the same direction through the coils, relative to a common terminal for the coils. During the next, i.e., second, on duty cycle portion, the currents supplied by transmitter circuits 23 and 30 to coils 12 and 13 flow in opposite directions in the coils relative to the common coil terminal.

Such a result is achieved by synthesizer 25 activating switches in transmitter circuits 23 and 30 so that the switches are activated in the same sequence, at the 60 KHz frequency, during the first duty cycle portion. During the second duty cycle portion, the switches in transmitter circuits 23 and 30 are operated in opposite manners in response to switching signals from frequency synthesizer and shaper 25 to cause the AC currents in coils 12 and 13 to have opposite relative polarities. Thus, for example, the switches of transmitter circuit 23 are always driven in the same sequence. In contrast, the switches of transmitter circuit 30 are driven during a first duty cycle portion in the same sequence as the switches of transmitter circuit 23, but during the next duty cycle portion, the activation times of the switches in transmitter circuit 30 are reversed relative to the activation times of the transmitter circuit 30 during the preceding burst.

By driving coils 12 and 13 with in phase and out of phase currents during different duty cycle portions, mutually orthogonal magnetic fields are derived from generator 11. This enables untuned coils 15 and 16 of receiver 14 to transduce the second magnetic fields of a card 17, regardless of the orientation of the card relative to coils 12 and 13. The result is achieved even though coils 12, 13, 15 and 16 are all vertically disposed planar loops of wire. The loops forming coils 12 and 13 are preferably non-overlapping rectangular loops having vertically and horizontally disposed sides.

In response to coils 12 and 13 being driven by in phase currents by circuits 23 and 30 to produce in phase magnetic field flux lines, i.e., flux lines that are directed in the same direction in the centers of the loops, a horizontally directed field at right angles to the plane of the loops is produced in the vicinity of adjacent wires of the loops forming coils 12 and 13. The magnetic flux lines between the centers of the loops forming coils 12 and 13, on one side of the plane of the loops, are oppositely directed in the vertical direction on opposite sides of adjacent wires of the loops forming coils 12 and 13.

Hence, in response to the stated in phase magnetic fluxes in the loops forming coils 12 and 13, there is a relatively intense magnetic flux field to provide X axis coverage for the magnetic field responsive elements in card 17 but there is a weak vertical magnetic field due to the cancellation effect of the oppositely directed vertical fields.

A vertically directed magnetic flux field in the region between tuned transmitter coils 12 and 13 and untuned coils 15 and 16 is provided by driving the loops forming coils 12 and 13 so the magnetic fluxes generated in the centers of the loop flow in opposite directions, i.e., have an out of phase relationship. The out of phase relationship for the fluxes of loops 12 and 13 causes the lines of flux to flow in opposite directions and cancel in the vicinity of adjacent, horizontally disposed conductor segments of the loops forming coils 12 and 13. The magnetic flux lines between the centers of the loops forming coils 12 and 13, on one side of the plane of the loops, are directed in the same vertical direction to cause the coils to be effectively a single coil. The vertically directed fluxes provide Z axis coverage for the magnetic field responsive elements in card 17.

The fringing fields resulting from the in phase and out of phase activation of the loops forming coils 12 and 13 provide magnetic flux vectors in the Y axis, i.e., in horizontal planes parallel to the planes containing the loops of tuned transmitter coils 12 and 13 and untuned receiver coils 15 and 16. Thereby, magnetic flux fields in three mutually orthogonal directions are derived from the loops forming coils 12 and 13 by virtue of the in phase and out of phase drives for these coils during different on duty cycle portions of transmitter circuits 23 and 30. These mutually orthogonal magnetic flux vectors provide coupling to enabled magneto-strictive card 17, regardless of the orientation of the card relative to the plane containing planar coils 12 and 13.

When an activated magneto-strictive card 17 is in the region between tuned coils 12, 13 and untuned coils 15, 16 at least one of the untuned coils derives an electric signal that is a replica of the AC magnetic field derived from card 17. Because untuned coils 15 and 16 have different non-overlapping spatial positions relative to each other, and card 17, as well as coils 12 and 13, there is a fairly high likelihood of the electric signals transduced by coils 15 and 16 differing from each other.

Receiver 14 determines if either of coils 15 or 16 is transducing a signal having the predetermined frequency, time duration and threshold amplitude necessary to signal the presence of an activated card in the region between coils 12, 13 and coils 15, 16. The voltages generated by coils 15 and 16 are sequentially coupled to the examining or detecting circuitry of receiver 14 during activation times following each 1.6 millisecond, 60 KHz on duty cycle burst from generator 11. After a first burst one of coils 15 or 16 is coupled to the remainder of receiver 14; after the following burst the other one of coils 15 or 16 is coupled to the remainder of the receiver. In response to one of coils 15 and 16 generating a voltage having the required frequency, duration and amplitude values, the sequential coupling of the coils 15 and 16 to the remainder of receiver 14 is terminated. Coils 15 and 16 are activated in such a situation so that the coil which generated the voltage having the desired frequency, duration and amplitude is the only coil coupled to the remainder of receiver 14, until that coils is no longer receiving a burst having the required frequency, duration and amplitude characteristics. Thereafter, coils 15 and 16 are sequentially and alternately coupled immediately after different bursts from generator 11 to the remaining circuitry of receiver 14.

To these ends, the voltages transduced by untuned coils 15 and 16 are respectively coupled to normally open circuited switches 31 and 32 by way of preamplifiers 33 and 34. During normal operation when no magnetic field having the desired characteristics is coupled to either of coils 15 or 16 immediately after a burst from generator 11, one of switches 31 or 32 is closed for 25 milliseconds simultaneously with the beginning of a 1.6 millisecond burst from generator 11. Simultaneously with the next burst, the other one of switches 31 or 32 is closed for 25 milliseconds. Switches 31 and 32 have a common, normally open circuited terminal connected to an input terminal of automatic gain controlled amplifier 35 by way of series capacitor 36, which enables only AC levels coupled through switches 31 and 32 to be fed to the input of amplifier 35. The gain of amplifier 35 is preset to a predetermined level so that in response to a voltage above a threshold value being induced in one of coils 15 and 16 and coupled to the input of amplifier 35, the amplifier derives a predetermined constant amplitude output having the same frequency as the magnetic field incident on the coil. In response to the input of amplifier 35 being a threshold level, the amplifier effectively derives a zero level.

Synchronous detector 37 responds to the AC bursts at the output of amplifier 35 which are above the threshold value to determine if these bursts have a carrier frequency equal to the frequency of the AC magnetic field derived from an activated magnetostrictive card 17. In addition, detector 37 determines the duration of bursts having the required carrier frequency. In response to a burst having the required carrier frequency and duration, synchronous detector 37 derives a binary one level which signals that an article containing an activated magnetostrictive card 17 is in the region between tuned coils 12, 13 and untuned coils 15, 16.

To control the operation of receiver 14 so that synchronous detector 37 is energized for the correct time interval associated with activated card 17 being in the region between tuned coils 12, 13 and untuned coils 15, 16 after each burst derived by generator 11, the detector is enabled by an output of frequency synthesizer 38. Synthesizer 38 responds to and is clocked by output pulses to zero crossing detector 39. The output pulses of detector 39 are synchronized with zero crossings of the AC voltage coupled by power line 19 to male plug 22. To this end, zero crossing detector 39 has an input connected to male plug 22, and an output on which a pulse is derived each time a zero crossing of the power line occurs. The pulse output of zero crossing detector 39 is applied to an input of frequency synthesizer 38.

To control the operation of switches 31 and 32 as described supra, logic circuit 41 includes first and second inputs respectively responsive to the output of synchronous detector 37 and frequency synthesizer 38. During normal operation, when synchronous detector 37 derives a binary zero output level to indicate that no activated card is between coils 12, 13 and 15, 16, logic circuit 41 responds to frequency synthesizer 38 so that immediately after first and second successive magnetic field bursts from generator 11, switches 31 and 32 are alternately activated to the closed state. In response to switch 31 being closed at the time synchronous detector 37 derives a binary one level to indicate an enabled card 17 between coils 12, 13 and 15, 16, logic circuit 41 causes switch 31 to be activated to the closed state, while maintaining switch 32 in the open state. This state of switches 31 and 32 is maintained until synchronous detector 37 again derives a binary zero level. If synchronous detector 37 derives a binary one level while switch 32 is closed, logic circuit 41 activates switches 31 and 32 so that these switches are respectively maintained in the open and closed states until a binary zero level is again derived by the synchronous detector.

Untuned coils 15 and 16 are effectively decoupled from the remainder of receiver 14 while magnetic fluxes are being derived from coils 12 and 13 because synchronous detector 37 is effectively disabled while magnetic field bursts are derived from them. Detector 37, in fact, is enabled by an output of synthesizer 38 only for a predetermined interval immediately after expiration of each on duty cycle portion of transmitter circuits 23 and 30. In addition, during the on duty cycle portions of transmitter circuits 23 and 30, frequency synthesizer 38 causes the gain of amplifier 35 to be reduced to zero, causing a zero output voltage to be coupled by the amplifier to detector 37. To this end, synthesizer 38 includes an output that is coupled as a control input to switch 43 which is normally activated to couple the output of amplifier 35 back to a gain control input of the amplifier. However, in response to the binary one output of frequency synthesizer 38 being coupled to the control input of switch 43, as occurs during the on duty cycle portions of transmitter circuits 23 and 30, switch 43 is activated to couple a negative DC voltage to a bias input of amplifier 35, to drive the amplifier gain to zero. Frequency synthesizer 38 controls synchronous detector 37 so that integrators in the detector are reset to zero during the on duty cycle portions of transmitter circuits 23 and 30.

DC operating power is supplied to amplifiers 33–35, synchronous detector 37, frequency synthesizer 38, zero crossing detector 39 and logic circuit 41 by DC power supply 42, connected to power line 19 by way of male plug 22.

Details of the configurations of tuned coils 12 and 13 and untuned coils 15 and 16 are described in copending, commonly assigned application Ser. No. 777,059 of John J. Torre et al, filed concurrently herewith, and bearing the title, "System Including Tuned AC Magnetic Field Transmit Antenna and Untuned AC Magnetic Field Receive Antenna."

Figure 2:
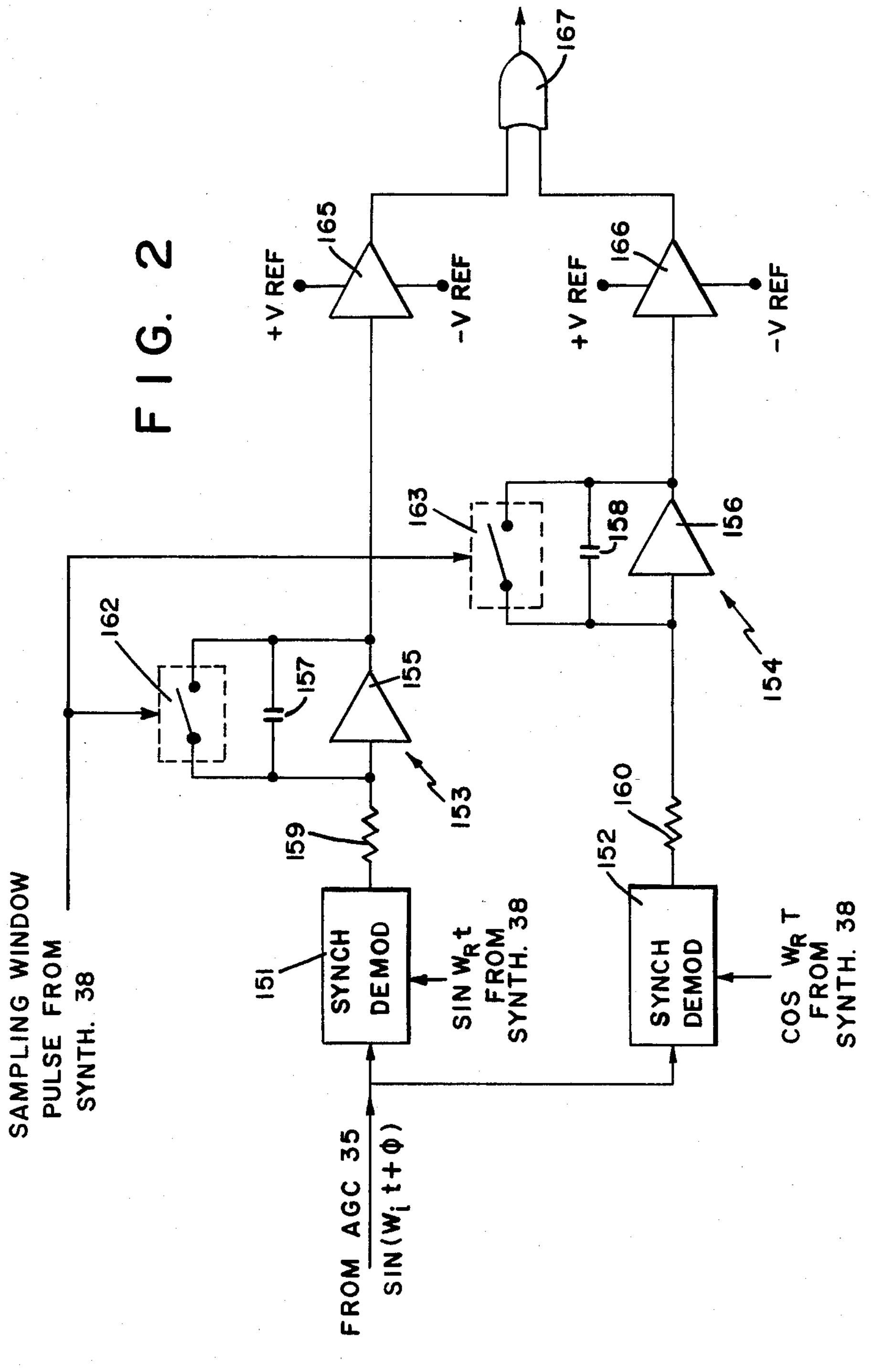
FIG. 2 is a schematic and circuit block diagram of synchronous detector 37.

Reference is now made to FIG. 2 of the drawing wherein synchronous detector 37 is illustrated as including synchronous demodulators 151 and 152, driven in parallel by the output of AGC amplifier 35. When an activated magneto-strictive card 17 is in the region between tuned transmitter coils 12, 13 and untuned receiver coils 15, 16, the output of amplifer 35, at the inputs of demodulators 151 and 152, can be assumed to be a constant amplitude sinusoid, except while coils 12 and 13 are excited during the on-duty cycle portion of generator 11. The sinusoidal input signal to demodulators 151 and 152 from amplifier 35 can be assumed to vary in accordance with:

$$\sin(\omega_i t + \phi),$$

where:

$\omega_i$ is the angular frequency of the AC wave derived from enabled card 17 after the on-duty cycle portion of transmitter 11 has terminated, t = time, and $\phi$ = the variable unpredictable phase of the carrier wave frequency derived from the structure on enabled card 17, as incident on the coil 15 or 16 feeding the remainder of the receiver.

For the purposes of this description it is assumed that the sinusoidal inputs to demodulators 151 and 152 subsist for the entire off-duty cycle portion of transmitter 11. In actuality, however, the sinusoidal inputs to demodulators 151 and 152 are damped sinusoids having a finite value during only a portion of the off-duty cycle portions of transmitter 11. When the amplitude of the damped sinusoid drops below a certain level, the inputs to demodulators 151 and 152 drop to zero, because of the characteristics of amplifier 35. As long as the sinusoid is above a predetermined level, the output amplitude of amplifier 35 is constant. The length of the constant amplitude sinusoidal output of amplifier 35 during each off-duty cycle portion of generator 11 is variable, as a function of the orientation of card 17 relative to tuned transmitter coils 12, 13 and untuned receiver coils 15, 16, as well as the location of the card in the region between the coils. However, due to the detection process employed in detector 37, the number of cycles of the carrier frequency $\omega_i$ from a typical enabled card in the region is sufficient to cause accurate detection of the card.

Synchronous detectors 151 and 152 are driven by orthogonal components of a reference wave, assumed to have a reference phase. The second inputs of synchronous demodulators 151, 152 can be respectively represented by:

$$\sin \omega_R t,$$

and $$\cos \omega_R t$$

where:

$\omega_R$=the angular frequency of the reference wave, which in turn is equal to the frequency of the AC carrier wave derived from the structure on card 17.

Synchronous demodulator 151 responds to the sin $(\omega_i t+\phi)$ and sin $\omega_R t$ inputs thereof to derive an output represented by:

$$\sin(\omega_i t+\phi)\sin \omega_R t.$$

Similarly, synchronous demodulator 152 multiplies the two input signals thereof to derive an output signal represented by:

$$\sin(\omega_i t+\phi)\cos \omega_R t.$$

The output signals of synchronous demodulators 151 and 152 are bipolarity signals that vary between plus and minus reference values, dependent upon the relative values of $\omega_i$, $\phi$ and $\omega_R$. In response to $\omega_i$ and $\omega_R$, being equal, the outputs of demodulators 151 and 152 are DC voltages. If, however, $\omega_i$ differs from $\omega_R$, because $\omega_i$ originates from a signal source other than card 17, demodulators 151 and 152 derive AC signals at the sum and difference frequencies $(\omega_i+\omega_R)$ and $(\omega_i-\omega_R)$. The indicated responses at the outputs of demodulators 151 and 152 are considered only for the difference or beat frequency $(\omega_i-\omega_R)$. No consideration of the sum frequency $(\omega_i+\omega_R)$ is necessary because the integration performed by detector 37 reduces these high frequency components to insignificant levels.

The output signals of demodulators 151 and 152 are respectively applied to analog signal integrators 153 and 154. Integrators 153 and 154 are standard integrators including high gain DC operational amplifiers 155 and 156, feedback capacitors 157 and 158, as well as input resistors 159 and 160. Integrators 153 and 154 are reset to zero, except during a sampling window having a duration T, during which the integrators are effectively responsive to output signals of demodulators 151 and 152. To this end, capacitors 157 and 158 are short-circuited by switches 162 and 163 which shunt them, except during the sampling window, which begins almost immediately after the expiration of each on duty cycle portion of transmitter 11. Switches 162 and 163 are simultaneously driven into the closed and open states by an output of synthesizer 30. The duration of sampling window T depends on the desired bandpass of synchronous detector 37, as described infra. The sampling window beging simultaneously with the AGC amplifier 35 being switched into an operative condition by switch 43 being coupled between the output of the amplifier and the bias input thereof.

The output levels of integrators 153 and 154 are constantly monitored by comparators 165 and 166, respectively. Comparators 165 and 166 normally derive binary zero level outputs. However, in response to the absolute value of the inputs of comparators 165 and 166 exceeding a reference value, $V_{REF}$, the comparators derive binary one output levels. Binary one output levels of comparators 165 and 166 are combined in OR gate 167. A binary one level is thus derived from OR gate 167 in response to the absolute value of the integrated response over the sampling window exceeding reference value $V_{REF}$. Comparators 165 and 166 derive the stated outputs in response to DC reference levels $+V_{REF}$ and $-V_{REF}$ being supplied thereto by DC supply 42.

Signal integrators 153 and 154 derive output voltages which linearly increase with time in response to DC outputs of synchronous demodulators 151 and 152 in accordance with:

$$V_1=\int_0^T[\sin(\omega_i t+\phi)\sin \omega_R t]dt,$$

and $$V_2=\int_0^T[\sin(\omega_i t+\phi)\cos \omega_R t]dt.$$

For the case where frequency $\omega i$ is the same as reference frequency $\omega_R$, as subsists when enabled card 17 is in the region between the transmitter and receiver coils, the output signals of integrators 153 and 154 at the completion of the sampling window, and prior to closure of switches 162 and 163, are respectively represented by $V_1=(T/2)\cos\phi$ and $V_2=(T/2)\sin\phi$. Hence, the amplitudes at the outputs of integrators 153 and 154 are solely proportional to the duration of receiver sampling window T and the relative phase angle $\phi$ between the signal coupled in parallel to demodulators 151 and 152 and the reference phase for $\omega_R$.

Because the relative phase angle $\phi$ is unpredictably variable between 0° and 360°, voltages $V_1$. and $V_2$ are bi-polarity voltages, having an amplitude indicative of $\phi$. This is why it is necessary to compare the absolute values of the outputs of integrators 153 and 154 with the reference level $V_{REF}$. The magnitude of $V_{REF}$ is selected so that the constant amplitude sinusoidal input sin $(\omega_i t+\phi)$ supplied to demodulators 151 and 152 results in a binary one output of each of comparators 165 and 166 when $\phi=45°$. The value of $V_{REF}$ can be determined to be equal to approximately 0.35T by equating $V_1=(T/2)$ cos $\phi$ for $\phi=0$, by using the actual value of $V_1$ at time T and taking into account input amplitude level and transfer function of integrators 153 and 154. This value of $V_1$ is multiplied by cos 45° (equal approximately to 0.707), resulting in $(T/2)\cos 45°=0.35T$. By setting $V_{REF}=0.35T$ all input signals having a frequency $\omega_i=\omega_R$, are detected, regardless of phase since either $V_1$ or $V_2$ is never less than 0.35T.

The duration of window T determines the effective bandpass of synchronous detector 37. If window T is long enough, any frequency $\omega_i$ which differs from $\omega_R$ will not be detected. This is because the beat frequencies derived by demodulators 151 and 152 ultimately are averaged by integrators 153 and 154 to a zero level. For the case of $\omega_i$ not equal to $\omega_R$, the output voltages of integrators 153 and 154, at the completion of sampling window T are represented by:

$$V_1 \int_0^T [\sin(\omega_i t + \phi)\sin\omega_R t]dt = \frac{\sin[(\omega_i - \omega_R)t + \phi]}{2(\omega_i - \omega_R)}$$

$$V_2 = \int_0^T [\sin(\omega_i t + \phi)\cos\omega_R t]dt = \frac{-\cos[(\omega_i - \omega_R)][t + \phi]}{2(\omega_i - \omega_R)}$$

Thus, integrators 153 and 154 respond to the beat frequencies, $(\omega_i - W_R)$, derived from demodulators 151 and 152. Integrators 153 and 154 average the sum frequencies, $(\omega_i + \omega_R)$, to insignificant levels, whereby the sum frequencies have no effect on the values of $V_1$ and $V_2$.

The band width of the demodulation and integration process can be determined by evaluating the two last presented equations at time $t=0$ and any other time t between zero and the maximum duration that the sinusoidal voltage can be derived from demodulators 151 and 152 for a response from magneto-strictive card 17. The bandwidth $(\omega_i - \omega_R)$ or $(\omega_R - \omega_i)$ is determined by using the actual values for time T and the input amplitude level and transfer functions of integrators 153 and 154 to calculate the magnitudes of $V_1$ and $V_2$. Taking into account the previously calculated value for $V_{REF}=0.35T$, the pass band of detector 37 is equal to $\pm 1/2T$. Typically, $T=1.6$ milliseconds, to provide the system with a pass band of approximately $\pm 300$ Hz.

The synchronous demodulator-integration process achieved by demodulators 151 and 152 and integrators 153 and 154 thus has a narrow frequency bandpass for long term sinusoidal signals, without including any tuned components. In addition, the demodulation-integration process is immune to impulse type noise, even though an impulse contains energy at all frequencies, including $\omega_R$. The energy at any particular frequency, including $\omega_R$, has a short duration which prevents the output signals of integrators 153 and 154 from having an absolute value in excess of reference value $V_{REF}$. Thus, receiver 14 is capable of discriminating an input signal having a frequency $\omega_R$ with a variable unpredictable phase, and predetermined time position in the presence of background energy, as subsists in impulse type noise. This is because of the synchronous detection process provided by synchronous demodulators 151 and 152 and the time duration detecting process involving signal integrators 153 and 154.

While there has been described and illustrated one specific embodiment of the invention, it will be clear that variations in the details of the embodiment specifically illustrated and described may be made without departing from the true spirit and scope of the invention as defined in the appended claims.

I claim:

1. Apparatus for detecting a pulse wave having a predetermined carrier frequency, variable unpredictable phase and predetermined time position, said wave being derived in the possible presence of background energy having the same frequency as the wave, the background energy subsisting at the predetermined frequency for an interval much less than the duration of pulses of the wave carier frequency, the apparatus comprising means for generating a reference wave having a reference phase at the carrier frequency, and means for synchronously detecting first and second orthogonal components of the carrier frequency to derive first and second responses respectively indicative of the phases of the first and second orthogonal components relative to said reference wave, said responses being independent of the amplitude of the carrier frequency components in the pulse wave, means synchronized into operation with the occurrence time of each pulsed wave for separately integrating the first and second responses over a predetermined interval, and means for indicating the presence of the pulsed wave having the predetermined carrier frequency in response to either of the first and second integrated responses having an absolute value in excess of a predetermined value during the predetermined interval.

2. The apparatus of claim 1 wherein said means for synchronously detecting includes first and second synchronous demodulators having first inputs respectively responsive to orthogonal phases of the carrier frequency of the reference wave and second inputs responsive to the carrier frequency of the pulsed wave, said first and second demodulators respectively deriving first and second signals having bipolar values and amplitudes indicative of the phase angles between the pulsed wave carrier frequency and the orthogonal phases of the carrier frequency of the reference wave.

3. The apparatus of claim 2 wherein said first and second inputs are sinusoidal signals.

4. The apparatus of claim 3 wherein said means for separately integrating includes first and second signal integrators respectively having first and second feedback capacitors, and means for discharging the feedback capacitors immediately prior to the occurrence time of the pulsed wave.

5. The apparatus of claim 4 wherein said first and second integrators are susceptible of deriving bipolar analog outputs in response to the first and second bipolar signals derived from said first and second demodulators.

6. The apparatus of claim 5 wherein said means for indicating includes first and second bi-polar comparators for deriving bi-level output signals having first and second values in response to the absolute value of the first and second integrated signals respectively exceeding and being less than a predetermined reference value.

7. The apparatus of claim 1 wherein said means for synchronously detecting includes AGC amplifier means for maintaining the amplitudes of the responses independent of the amplitude of the carrier frequency components in the pulse wave.

8. The apparatus of claim 1 wherein the integrating means is activated for an interval, T, that is sufficiently long relative to a period of the pulsed wave carrier frequency as to accumulate the responses for many cycles of the pulsed wave carrier frequency to obtain a substantial non-zero value in response thereto and to provide a zero net accumulation of the responses for frequencies which are only slightly displaced from the pulsed wave carrier frequency, the predetermined value (V) being related to the duration T by approximately $V=0.35T$, the frequencies causing a zero net accumulation of the responses differing from the pulsed wave carrier frequency by in excess of $\pm\frac{1}{2}T$.

9. Apparatus for detecting a pulsed wave having a predetermined carrier frequency, variable unpredictable phase and predetermined time position, said wave being derived in the possible presence of background energy having the same frequency as the wave, the background energy subsisting at the predetermined frequency for an interval much less than the duration of pulses of the wave carrier frequency, the apparatus comprising means for generating a reference wave having a reference phase at the carrier frequency, and means for synchronously detecting components of the carrier frequency to derive a response indicative of the phase of the components relative to said reference wave, said response being independent of the amplitude of the carrier frequency components in the pulsed wave, means synchronized into operation with the occurrence time of each pulsed wave for integrating the response over a predetermined interval, and means for indicating the presence of the pulsed wave having the predetermined carrier frequency in response to the integrated response having an absolute value in excess of a predetermined value during the predetermined interval.

10. The apparatus of claim 9 wherein said means for synchronously detecting includes a synchronous demodulator having a first input responsive to a reference phase of the carrier frequency of the reference wave and a second input responsive to the carrier frequency of the pulsed wave for deriving a signal having a bipolar value and an amplitude indicative of the phase angle between the pulsed wave carrier frequency and the reference phase of the carrier frequency of the reference wave.

11. The apparatus of claim 10 wherein said means for integrating includes an analog integrator having a first feedback capacitor, and means for discharging the feedback capacitor immmediately prior to the occurrence time of the pulsed wave.

12. The apparatus of claim 11 wherein said integrator is susceptible of deriving a bi-polar analog output in response to the bi-polar signal derived from said demodulator.

13. The apparatus of claim 12 wherein said means for indicating includes a bi-polar comparator for deriving a bi-level output signal havng first and second values in response to the absolute value of the integrated signal respectively exceeding and being less than a predetermined reference value.

14. The apparatus of claim 9 wherein said means for synchronously detecting includes AGC amplifier means for maintaining the amplitudes of the responses independent of the amplitude of the carrier frequency components in the pulsed wave.

15. The apparatus of claim 9 wherein the integrating means is activated for an interval, T, that is sufficiently long relative to a period of the pulsed wave carrier frequency as to accumulate the responses for many cycles of the pulsed wave carrier frequency to obtain a substantial non-zero value in response thereto and to provide a zero net accumulation of the responses for frequencies which are only slightly displaced from the pulsed wave carrier frequency, the predetermined value (V) being related to the duration T by approximately $V=0.35T$, the frequencies causing a zero net accumulation of the responses differing from the pulsed wave carrier frequency by in excess of $\pm 1/2T$.

16. The apparatus of claim 9 further including means for resetting said integrating means to zero immediately prior to the occurrence time of the pulsed wave.

17. An inductive magnetic field article surveillance system wherein articles to be monitored include a structure for receiving pulses of a first inductive magnetic field having a predetermined frequency and for deriving a pulsed second inductive magnetic field wave having a predetermined carrier frequency, the system comprising means for generating the first magnetic field pulses, said generating means including: inductive transmitter coil means for generating the first magnetic field pulses to derive the pulsed second magnetic field wave; an inductive magnetic field receiver responsive to the second magnetic field, said receiver including: means for generating a reference wave having a reference phase at the carrier frequency, and inductive receiver coil means responsive to the second magnetic field for deriving a signal that is a replica of variations of the second magnetic field as incident on the receiver coil means, the signal being at the predetermined carrier frequency and having a variable unpredictable phase and predetermined time position relative to the pulses of the first field, said wave being derived in the possible presence of background magnetic flux having the same frequency as the wave, the background magnetic flux subsisting at the predetermined frequency for an interval much less than the duration of pulses of the wave carrier frequency, the receiver further including: means for synchronously detecting components of the carrier frequency to derive a response indicative of the phase of the components relative to said reference wave, said response being independent of the amplitude of the carrier frequency components in the pulsed wave, means synchronized into operation with the derivation of pulses of the first magnetic field for integrating the response over a predetermined interval, and means for indicating the presence of the pulsed wave having the predetermined carrier frequency in response to the integrated response having an absolute value in excess of a predetermined value during the predetermined interval.

18. The apparatus of claim 17 wherein said means for synchronously detecting includes first and second synchronous demodulators having first inputs respectively responsive to orthogonal phases of the carrier frequency of the reference wave and second inputs responsive to the carrier frequency of the pulsed wave for deriving first and second signals having bipolar values and amplitudes indicative of the phase angles between the pulsed wave carrier frequency and the orthogonal phases of the carrier frequency of the reference wave.

19. The apparatus of claim 18 wherein said means for integrating is separately responsive to said first and second signals to derive first and second integrated signals, and means for resetting the integrating means to zero immediately prior to the expiration time of the first pulsed magnetic field.

20. The apparatus of claim 19 wherein said means for indicating includes bi-polar comparator means for defiving bi-level output signals having first and second values in response to the absolute value of the first and second integrated signals respectively exceeding and being less than a predetermined reference value.

21. The apparatus of claim 17 wherein the integrating means is activated from an interval, T, that is sufficiently long relative to a period of the pulsed wave carrier frequency as to accumulate the responses for many cycles of the pulsed wave carrier frequency to obtain a substantial non-zero value in response thereto and to provide a zero net accumulation of the responses for frequencies which are only slightly displaced from the pulsed wave frequency, the predetermined value (V) being related to the duration T by approximately $V=0.35T$, the frequencies causing a zero net accumulation of the responses differing from the pulsed wave carrier frequency by in excess of $\pm\frac{1}{2}T$.

22. The method of detecting a pulsed wave having a predetermined carrier frequency, variable unpredictable phase and predetermined time position, said wave being derived in the possible presence of background energy having the same frequency as the wave, the background energy subsisting at the predetermined frequency for an interval much less than the duration of pulses of the wave carrier frequency, the method comprising the steps of generating a reference wave having a reference phase at the carrier frequency, synchronously detecting components of the carrier frequency to derive a response indicative of the phase of the components relative to said reference wave, said response being independent of the amplitude of the carrier frequency components in the pulsed wave, integrating the response over a predetermined interval, performing the integrating step in synchronism with the occurrence time of each pulsed wave, indicating the presence of the pulsed wave having the predetermined carrier frequency in response to the integrated response having an absolute value in excess of a predetermined value during the predetermined interval.

* * * * *